(12) United States Patent
Han et al.

(10) Patent No.: US 12,150,346 B2
(45) Date of Patent: Nov. 19, 2024

(54) DISPLAY DEVICE

(71) Applicant: LG Display Co., Ltd., Seoul (KR)

(72) Inventors: Min Ji Han, Paju-si (KR); Su Jin Jeon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/357,801

(22) Filed: Jul. 24, 2023

(65) Prior Publication Data

US 2024/0260318 A1 Aug. 1, 2024

(30) Foreign Application Priority Data

Jan. 30, 2023 (KR) .......................... 10-2023-0011756

(51) Int. Cl.
*G09G 3/3233* (2016.01)
*H10K 59/121* (2023.01)
*G09G 3/20* (2006.01)

(52) U.S. Cl.
CPC ....... *H10K 59/1216* (2023.02); *G09G 3/3233* (2013.01); *G09G 3/2092* (2013.01); *G09G 2300/0819* (2013.01); *G09G 2300/0842* (2013.01); *G09G 2300/0861* (2013.01); *G09G 2310/08* (2013.01); *G09G 2320/0247* (2013.01); *G09G 2320/045* (2013.01)

(58) Field of Classification Search
CPC ............. H10K 59/1216; G09G 3/3233; G09G 3/2092; G09G 2300/0819; G09G 2300/0842; G09G 2300/0861; G09G 2310/08; G09G 2320/0247; G09G 2320/045

See application file for complete search history.

(56) References Cited

U.S. PATENT DOCUMENTS

2021/0319747 A1* 10/2021 Jeon ...................... G09G 3/3233

* cited by examiner

*Primary Examiner* — Abdul-Samad A Adediran
(74) *Attorney, Agent, or Firm* — Birch, Stewart, Kolasch & Birch, LLP

(57) ABSTRACT

A display device can include a light-emitting element; a driving transistor including a first electrode connected to a first node, a gate electrode connected to a second node, and a second electrode connected to a third node connected to the light-emitting element, the driving transistor being configured to apply a current the third node during a sampling operation and control a high-potential voltage applied to the first node according to a data voltage applied to the gate electrode to apply the high-potential voltage to the third node during a light-emitting operation. Also, the display device can include a switching circuit to apply a current for charging the data voltage to the second node by connecting the second node with the third node during the sampling operation; and a blocking device to block leakage current from flowing from the switching circuit to the second node when the switching circuit is off.

19 Claims, 8 Drawing Sheets

DISPLAY DEVICE

CROSS REFERENCE TO RELATED APPLICATION

This application claims priority under 35 U.S.C. § 119(a) to Korean Patent Application No. 10-2023-0011756, filed in the Republic of Korea on Jan. 30, 2023, which is hereby incorporated by reference as if fully set forth herein.

BACKGROUND

Field of the Invention

The present disclosure relates to a display device.

Discussion of the Related Art

Organic light emitting display devices that have recently been in the limelight as display devices use an organic light emitting diode (OLED) that emits light by itself, and thus have advantages of a high response speed, a high contrast ratio, high luminous efficacy, a high luminance, and a wide viewing angle.

A sub-pixel of an organic light emitting display device can include an organic light emitting diode, a driving transistor, and a switching transistor. In the sub-pixel, the switching transistor charges a data signal in the sub-pixel in response to a scan signal, and the driving transistor controls the gray level of each pixel by adjusting the amount of current supplied to the corresponding organic light emitting diode in response to a data voltage.

Also, when an oxide transistor is used as a switching transistor connected to the gate electrode of the driving transistor, and is turned on an off, a kick-back phenomenon can occur that causes undesirable charge injection that can temporarily increase the luminance of a displayed image which can lead to a noticeable flicker that can impair a user's viewing experience, especially during low-speed operation.

Since the image quality of such an organic light emitting display device is greatly affected by the current driving capability of sub-pixels, efforts are required to improve the accuracy and stability of operations of driving transistors and switching transistors. Also, more stable luminance and better image quality is desired.

SUMMARY OF THE DISCLOSURE

Accordingly, the present disclosure is directed to a display device that substantially obviates one or more problems due to limitations and disadvantages of the related art.

Embodiments disclosed in the present disclosure are intended to solve the above problems, and provide a display device capable of improving the accuracy and stability of operations of driving transistors and switching transistors of sub-pixels.

Additional advantages, objects, and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these objects and other advantages and in accordance with the purpose of the disclosure, as embodied and broadly described herein, a display device includes a light-emitting element, a driving thin film transistor (TFT) including a first electrode connected to a first node, a gate electrode connected to a second node, and a second electrode connected to a third node connected to the light-emitting element, and configured to apply a current according to a data voltage applied to the first node to the third node during a sampling operation and to control a high-potential voltage applied to the first node according to the data voltage applied to the gate electrode to apply the high-potential voltage to the third node during a light-emitting operation, a switching circuit configured to apply a current for charging the data voltage to the second node by connecting the second node and the third node during the sampling operation, and a blocking unit configured to block leakage current applied from the switching circuit to the second node when the switching circuit is turned off.

The switching circuit can be turned on by a first scan signal at an on level, apply the current applied to the third node to the second node, and then be turned off by the first scan signal at an off level, and the blocking unit can receive an inverted first scan signal and be activated when the switching circuit is turned off to block leakage current applied to the second node.

The switching circuit can be turned on by the first scan signal input to a gate electrode of the switching circuit to form a channel layer, and the blocking unit can include a capacitor connected to a node opposite to the gate electrode of the switching circuit with respect to the channel layer.

The switching circuit can receive the first scan signal at a high level to form the channel layer, and the blocking unit can block the leakage current by receiving the inverted first scan signal.

The capacitor can include one electrode connected to the node opposite to the gate electrode of the switching circuit, and another electrode to which the inverted first scan signal is input.

The switching circuit can include a first switching TFTa including a gate electrode to which the first scan signal is input, a first electrode connected to the second node, and a second electrode connected to a node B, and a first switching TFTb including a gate electrode to which the first scan signal is input, a first electrode connected to the node B, and a second electrode connected to the third node. Also, the first switching TFTa can be referred to as a first-first switching transistor and the first switching TFTb can be referred to as a first-second switching transistor.

The blocking unit can include a capacitor including one electrode connected to the node B and another electrode to which the inverted first scan signal is input.

The switching circuit can be implemented as an n-type oxide transistor.

In another aspect of the present disclosure, a display device includes a light-emitting element, a driving TFT including a first electrode connected to a first node, a gate electrode connected to a second node, and a second electrode connected to a third node connected to the light-emitting element, and configured to apply a current according to a data voltage applied to the first node to the third node during a sampling operation and to control a high-potential voltage applied to the first node according to the data voltage applied to the gate electrode to apply the high-potential voltage to the third node during a light-emitting operation, a switching circuit configured to apply the current of the third node to the second node as a current for charging the data voltage by forming a channel layer by a first scan signal input to a gate electrode during the sampling operation, and a capacitor connected to a node opposite to the gate electrode of the switching circuit with respect to the channel layer and configured to block leakage current generated in the channel layer by receiving an inverted first scan signal when the switching circuit is turned off.

The switching circuit can include a first switching TFTa including a gate electrode to which the first scan signal is input, a first electrode connected to the second node, and a second electrode connected to a node B, and a first switching TFTb including a gate electrode to which the first scan signal is input, a first electrode connected to the node B. and a second electrode connected to the third node.

The capacitor can include one electrode connected to the node B. and another electrode to which the inverted first scan signal is input.

The first switching TFTa and the first switching TFTb can be implemented as n-type oxide transistors.

It is to be understood that both the foregoing general description and the following detailed description of the present disclosure are examples and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE EMBODIMENTS

Figure 1:
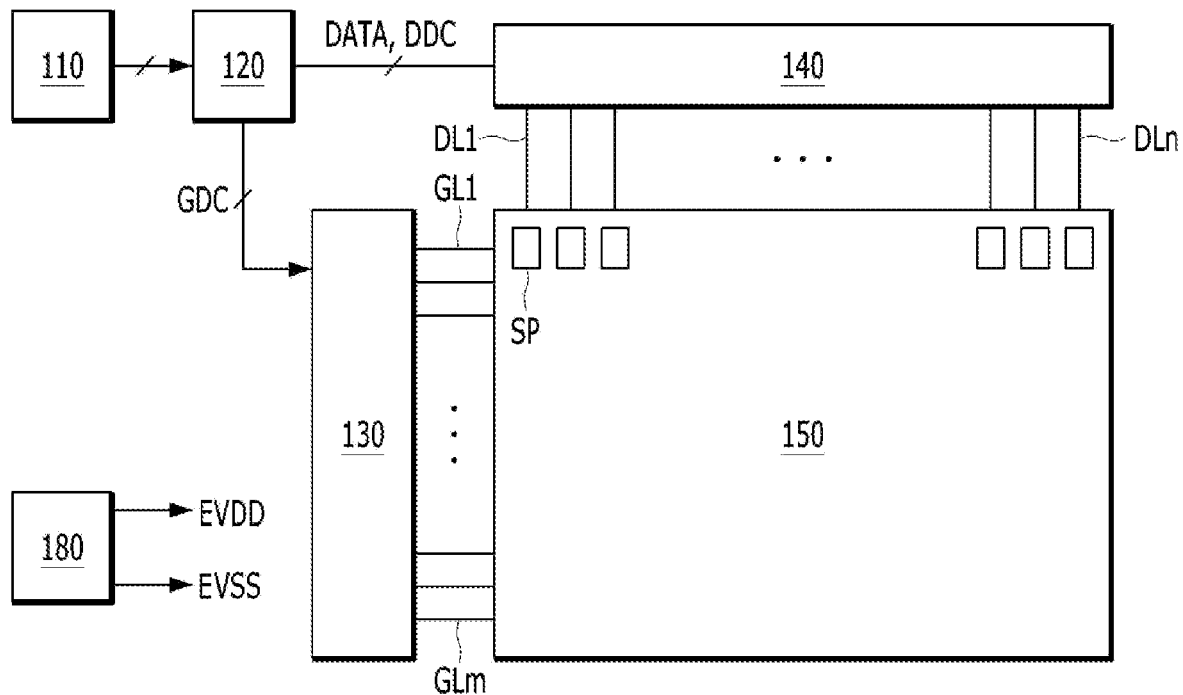
FIG. 1 is a schematic block diagram of a display device according to an embodiment of the present disclosure.

The advantages, features and methods for accomplishing the same of the present disclosure will become more apparent through the following detailed description with respect to the accompanying drawings. However, the present disclosure is not limited by embodiments described below and is implemented in various different forms, and the embodiments are provided so that this disclosure will be thorough and complete, and will fully convey the scope of the disclosure to those skilled in the art.

Shapes, sizes, ratios, angles, numbers, etc. shown in the figures to describe embodiments of the present disclosure are exemplary and thus are not limited to particulars shown in the figures. Like numbers refer to like elements throughout the specification. It will be further understood that, when the terms "include," "have" and "comprise" are used in the present disclosure, other parts can be added unless "only" is used. An element described in the singular form is intended to include a plurality of elements unless context clearly indicates otherwise.

In interpretation of a component, the component is interpreted as including an error range unless otherwise explicitly described.

It will be understood that, when an element is referred to as being "on," "above," "under" or "by" another element, it can be "directly" on or under another element or can be "indirectly" formed such that an intervening element is also present.

In the following description of the embodiments, "first" and "second" are used to describe various components, but such components are not limited by these terms. The terms are used to discriminate one component from another component. Accordingly, a first component mentioned in the following description can be a second component within the technical spirit of the present disclosure.

In addition, a pixel circuit of a display device which will be described below can include a plurality of transistors. The transistors can be implemented as oxide thin film transistors (TFTs) including oxide semiconductors, low temperature polysilicon (LTPS) TFTs including LTPS, and the like. Each transistor can be implemented as a p-channel TFT or an n-channel TET.

A transistor is a three-electrode device including a gate, a source, and a drain. The source is an electrode that supplies carriers to the transistor. In the transistor, carriers begin to flow from the source. The drain is an electrode through which carriers exit the transistor. In the transistor, carriers flow from the source to the drain. In the situation of an n-type transistor, a source voltage is lower than a drain voltage such that electrons can flow from the source to the drain because carriers are electrons. In an n-type transistor, current flows from the drain to the source. In the situation of a p-type transistor (PMOS), a source voltage is higher than a drain voltage such that holes can flow from the source to the drain because carriers are holes. In a p-type transistor, current flows from the source to the drain because holes flow from the source to the drain. It should be noted that the source and the drain of the transistor are not fixed. For example, the source and the drain can be changed according to an applied voltage. Accordingly, the disclosure is not limited by the source and the drain of the transistor. In the following description, the source and the drain of the transistor will be referred to as first and second electrodes.

A gate signal swings between a gate on voltage and a gate off voltage. The gate-on voltage is set to a voltage higher than the threshold voltage of the transistor, and the gate-off voltage is set to a voltage lower than the threshold voltage of the transistor. The transistor is turned on in response to the gate-on voltage and turned off in response to the gate-off voltage. In the situation of an n-type transistor, the gate-on voltage can be a gate high voltage (VGH) and the gate-off voltage can be a gate low voltage (VGL). In the situation of a p-type transistor, the gate-on voltage can be the gate low voltage VGL, and the gate-off voltage can be the gate high voltage VGH.

Each of pixels of an electroluminescent display device includes a light emitting element and a driving element that drives the light emitting element by generating a pixel current according to a gate-source voltage. The light emitting element includes an anode, a cathode, and an organic compound layer formed between the anode and the cathode. The organic compound layer includes a hole injection layer (HIL), a hole transport layer (HTL), an emission layer (EML), an electron transport layer (ETL), an electron injection layer (EIL), and the like, but is not limited thereto. When the pixel current flows through the light emitting element, holes that have passed through the hole transport layer (HTL) and electrons that have passed through the electron transport layer (ETL) move to the light emitting layer (EML) to generate excitons, and as a result, the light emitting layer (EML) can emit visible light.

Recently, an increasing number of attempts have been made to implement some transistors included in a pixel circuit of an electroluminescent display device as oxide transistors. An oxide transistor uses an oxide, for example, IGZO, which is a combination of In (indium), Ga (gallium), Zn (zinc), and O (oxygen), instead of polysilicon as a semiconductor material.

Oxide transistors have lower electron mobility than low temperature polysilicon (LTPS) transistors but have more than 10 times higher electron mobility than amorphous silicon transistors, and are higher than amorphous silicon transistors but much less expensive than low-temperature polysilicon transistors in terms of manufacturing cost. In addition, since the manufacturing process of the oxide transistors is similar to that of the amorphous silicon transistors, there is an efficient advantage in that existing facilities can be utilized and less retooling is needed. In particular, since the oxide transistors have a low off current, driving stability and reliability are high during a low-speed operation with a relatively long off-period of the transistors. Therefore, the oxide transistors can be used in a large liquid crystal display that requires high resolution and low power consumption or an OLED TV that cannot cope with the screen size with a low-temperature polysilicon process.

A display device according to the present disclosure can be implemented as a television system, a video player, a personal computer (PC), a home theater, a vehicle electric apparatus, a smartphone, or the like, but the present disclosure is not limited thereto. The display device according to an embodiment of the present disclosure can be implemented as a light emitting display device (LED), a quantum dot display (QDD) device, a liquid crystal display (LCD) device, or the like. However, a light emitting display device that directly emits light based on inorganic light emitting diodes or organic light emitting diodes will be described as an example for convenience of description.

Like numbers refer to like elements throughout the specification. Hereinafter, embodiments of the present disclosure will be described in detail with reference to the attached drawings. In the following description, if a detailed description of known techniques associated with the present disclosure would unnecessarily obscure the gist of the present disclosure, detailed description thereof will be omitted.

The features of various embodiments of the present disclosure can be partially or entirely coupled to or combined with each other and can be interlocked and operated in technically various ways, and the embodiments can be carried out independently of or in association with each other.

FIG. 1 is a schematic block diagram showing a configuration of a display device.

Referring to FIG. 1, the display device can include an image provider 110 (e.g., host system), a timing controller 120, a scan driver 130, a data driver 140, a display panel 150, and a power supply 180.

The image provider 110 can output various driving signals along with an externally supplied image data signal or an image data signal stored in an internal memory. The image provider 110 can supply data signals and various driving signals to the timing controller 120.

The timing controller 120 can output a gate timing control signal GDC for controlling the operation timing of the scan driver 130, a data timing control signal DDC for controlling the operation timing of the data driver 140, and various synchronization signals including a vertical synchronization signal and a horizontal synchronization signal. The timing controller 120 can supply the data timing control signal DDC and a data signal DATA supplied from the image provider 110 to the data driver 140. The timing controller 120 can be implemented in the form of an integrated circuit (IC) and mounted on a printed circuit board, but the present disclosure is not limited thereto.

The data driver 140 can convert the digital data signal DATA into an analog data voltage in response to the data timing control signal DDC supplied from the timing controller 120 and output the converted data voltage. The data driver 140 can supply data voltages to sub-pixels SP included in the display panel 150 through data lines DL1 to DLn. The data driver 140 can be implemented in the form of an IC and mounted on the display panel 150 or mounted on a printed circuit board, but the present disclosure is not limited thereto.

The scan driver 130 can output a scan signal and an emission signal in response to the gate timing control signal GDC supplied from the timing controller 120. The scan driver 130 can supply at least one scan signal and an emission signal to the sub-pixels SP included in the display panel 150 through gate lines GL1 to GLm. The scan driver 130 can be implemented in the form of an IC or directly formed on the display panel 150 in a gate-in-panel structure.

The power supply 180 can convert power supplied from the outside into power necessary to drive the display device and output the converted power according to the control of the timing controller 120. For example, the power supply 180 can convert power supplied from the outside into a high-potential voltage EVDD and a low-potential voltage EVSS, output the converted voltages, and generate and output a voltage used to drive the scan driver 130 or a voltage used to drive the data driver 140.

The display panel 150 includes a plurality of data lines DL1 to DLn extending in a column direction (or vertical direction) and a plurality of gate lines GL1 to GLm extending in a row direction (or horizontal direction) intersecting the data lines, and sub-pixels SPs disposed at respective intersections in a matrix form to form a pixel array. Each sub-pixel SP includes a light emitting element and a pixel circuit that controls the amount of current applied to the anode of the light emitting element. The pixel circuit can include a driving TFT DT for controlling an amount of current such that a constant current flows through the light emitting device. The light emitting element emits light during an emission period and does not emit light during periods other than the emission period. In periods other than the emission period, initialization and programming of the pixel circuit and reset of the light emitting device can be performed.

Figure 2:
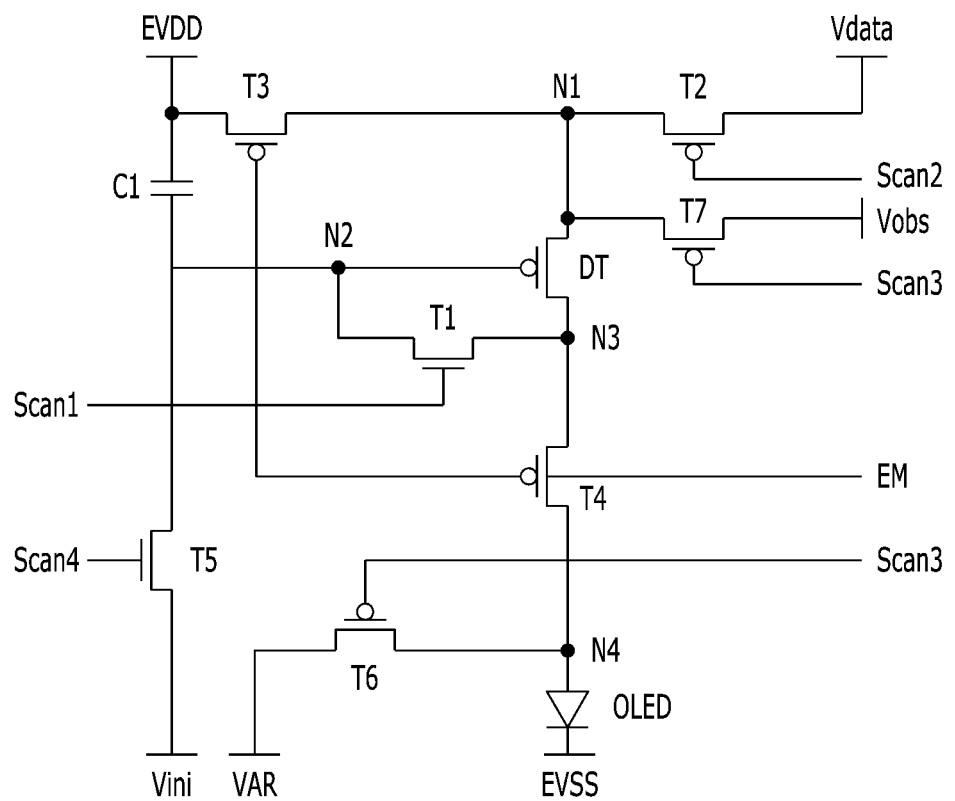
FIG. 2 is a schematic configuration diagram of a sub-pixel according to an embodiment of the present disclosure.

FIG. 2 is a schematic configuration diagram of a sub-pixel SP.

In the following description, a first electrode of a transistor can be any one of a source electrode and a drain electrode, and a second electrode of the transistor can be the other one of the source electrode and the drain electrode.

One sub-pixel SP can be provided with the high-potential voltage EVDD, the low-potential voltage EVSS, an initialization voltage VINI, an anode reset voltage VAR, and an on bias stress (OBS) voltage Vobs and can receive first to fourth scan signals Scan1 to Scan4, an emission signal EM, and a data voltage signal Vdata.

One sub-pixel SP can include an organic light emitting diode OLED, a driving TFT DT, a first capacitor C1, and first to seventh switching TFTs T1 to T7. Each TFT of the sub-pixel SP can be a p-type MOSFET (PMOS) or an n-type MOSFET (NMOS). For example, the first switching TFT T1 and the fifth switching TFT T5 can be implemented as n-type, and the driving TFT DT and the remaining switching TFTs T2 to T4, T6 and T7 can be implemented as p-type, but the present disclosure is not limited thereto.

The OLED emits light by a driving current supplied from the driving TFT DT. The anode of the OLED is connected to a fourth node N4, and the cathode of the OLED is connected to a wire through which the low-potential voltage EVSS is supplied.

The gate electrode of the driving TFT DT can be connected to a second node N2, the first electrode can be connected to a first node N1, and the second electrode can be connected to a third node N3. The driving TFT DT can generate a driving current in response to the data voltage signal Vdata. The driving TFT DT can be a p-type MOSFET (PMOS) and can be implemented as a low-temperature polycrystalline silicon (LTPS) thin film transistor.

The third switching TFT T3 and the fourth switching TFT T4 can control whether the OLED emits light. The third switching TFT T3 and the fourth switching TFT T4 are simultaneously turned on/off according to the emission signal EM simultaneously input to gate electrodes thereof. The third switching TFT T3 can have a first electrode connected to the high-potential voltage EVDD and a second electrode connected to the first node N1. The third switching TFT T3 can serve to transfer the high-potential voltage EVDD to the first electrode of the driving TFT DT in response to the emission signal EM. The fourth switching TFT T4 can have a first electrode connected to the third node N3 and a second electrode connected to the fourth node N4. The fourth switching TFT T4 can serve to transfer the driving current to the anode of the OLED in response to the emission signal EM. The third switching TFT T3 and the fourth switching TFT T4 can be p-type MOSFETs (PMOSs) and can be implemented as low-temperature polycrystalline silicon (LTPS) thin film transistors.

The first capacitor C1 maintains a data voltage Vdata stored in the sub-pixel SP for one frame. One electrode of the first capacitor C1 is connected to the second node N2 to which the gate electrode of the driving TFT DT is connected, and the other electrode is connected to the high-potential voltage EVDD.

The first switching TFT T1 connects the gate electrode and the drain electrode, which is the second electrode of the driving TFT DT to diode-connect the driving TFT DT. The first switching TFT T1 can include a gate electrode connected to an input line of the first scan signal SCAN1, a first electrode connected to the second node N2, and a second electrode connected to the third node N3. The first switching TFT T1 can be an n-type MOSFET (NMOS) or implemented as an oxide thin film transistor in order to reduce an off-current and minimize leakage current during a turn-off period. Accordingly, the first switching TFT T1 diode-connects the gate electrode and the drain electrode of the driving TFT DT in response to the first scan signal Scan1 at a high level, which is a turn-on voltage.

The second switching TFT T2 applies the data voltage signal Vdata to the first node N1 corresponding to the first electrode of the driving TFT DT. The second switching TFT T2 can include a gate electrode connected to an input line of the second scan signal Scan2, a first electrode connected to a data line through which the data voltage signal Vdata is supplied, and a second electrode connected to the first node N1. The second switching TFT T2 can be a p-type MOSFET (PMOS), and can be implemented as an LTPS thin film transistor. Accordingly, the second switching TFT T2 applies the data voltage signal Vdata supplied from the data line to the first node N1 corresponding to the first electrode of the driving TFT DT in response to the second scan signal Scan2 at a low level, which is a turn-on voltage.

The fifth switching TFT T5 applies the initialization voltage VINI to the second node N2 corresponding to the gate electrode of the driving TFT DT. The fifth switching TFT T5 can include a gate electrode connected to an input line of the fourth scan signal SCAN4, a first electrode connected to the initialization voltage VINI, and a second electrode connected to the second node N2. The fifth switching TFT T5 can be an n-type MOSFET (NMOS) or implemented as an oxide thin film transistor in order to reduce an off current and minimize leakage current during a turn-off period. Accordingly, the fifth switching TFT T5 applies the initialization voltage VINI to the second node N2 corresponding to the gate electrode of the driving TFT DT in response to the fourth scan signal Scan4 at a high level, which is a turn-on voltage.

The sixth switching TFT T6 applies the anode reset voltage VAR to the anode of the OLED. The sixth switching TFT T6 can include a gate electrode connected to the input line of the third scan signal Scan3, a first electrode connected to the anode reset voltage VAR, and a second electrode connected to the fourth node N4. The sixth switching TFT T6 can be a p-type MOSFET (PMOS), and can be implemented as an LTPS thin film transistor. Accordingly, the sixth switching TFT T6 applies the anode reset voltage VAR to the anode of the OLED in response to the third scan signal Scan3 at a low level, which is a turn-on voltage.

The seventh switching TFT T7 applies the OBS voltage Vobs to the first electrode of the driving TFT DT. The seventh switching TFT T7 can include a gate electrode connected to the input line of the third scan signal SCAN3, a first electrode connected to the OBS voltage Vobs, and a second electrode connected to the first node N1. The seventh switching TFT T7 can be a p-type MOSFET (PMOS), and can be implemented as an LTPS thin film transistor. Accordingly, the seventh switching TFT T7 applies the OBS voltage Vobs to the first electrode of the driving TFT DT in response to the third scan signal Scan3 at a low level, which is a turn-on voltage.

In the sub-pixel SP having this configuration, the fifth switching TFT T5 is turned on and thus the initialization voltage VINI is applied to the second node N2 corresponding to the gate electrode of the driving TFT DT during an initialization operation, and the first switching TFT T1 is turned on and thus the driving TFT DT is diode-connected to sample the data voltage Vdata applied to the first node N1 to the second node N2 during a sampling operation. Therefore, the first switching TFT T1 and the fifth switching TFT T5 can be implemented as n-type oxide transistors having excellent off characteristics (that is, low off current) to improve operation stability and reliability during a low-speed operation in which a transistor off period is relatively long.

However, if the first switching TFT T1 connected to the second node N2 corresponding to the gate electrode of the driving TFT DT and the third node N3 corresponding to the drain electrode of the driving TFT DT is implemented as an oxide transistor, undesirable charge injection may occur in the gate electrode of the driving TFT DT.

Figure 3:
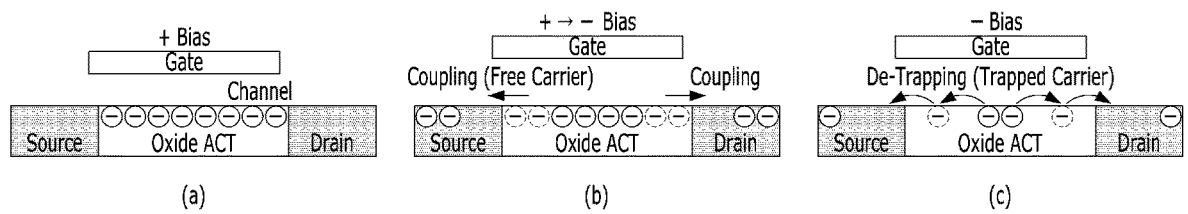
FIGS. 3 and 4 are diagrams for describing charge injection that may occur in the sub-pixel of FIG. 2 according to an example embodiment of the present disclosure.
Figure 4:
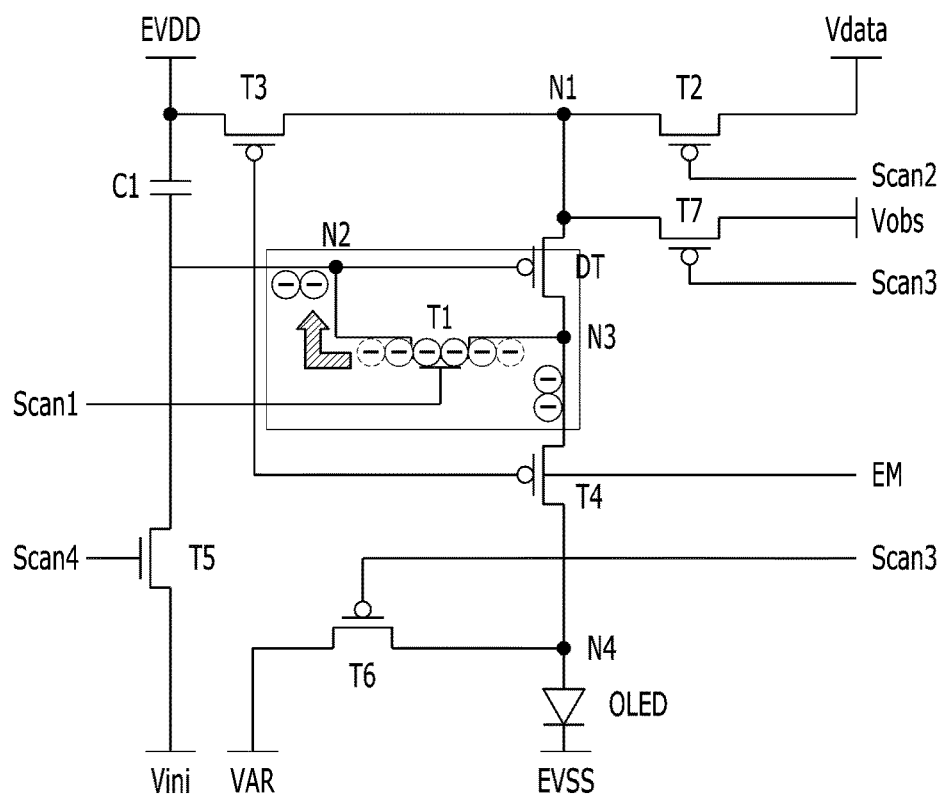

FIGS. 3 and 4 are diagrams for describing charge injection that can occur in the gate electrode of the driving TFT DT.

Part (a) of FIG. 3 is a diagram showing a turn-on state of the first switching TFT T1 implemented as an oxide transistor, part (b) is a diagram showing a transition from a turn-on state to a turn-off state, and part (c) is a diagram showing a turn-off state of the first switching TFT T1.

Referring to FIGS. 3 and 4, the first switching TFT T1 can be implemented as an n-channel TFT including an oxide semiconductor active layer Oxide ACT. The first switching TFT T1 is a three-electrode device including a gate, a source, and a drain. When a gate-on voltage (+Bias) higher than the threshold voltage of the transistor is applied to the gate, a channel is formed and thus the first switching TFT T1 is turned on, and when a gate off voltage (−Bias) lower than the threshold voltage is applied, the first switching TFT T1 is turned off. Since carriers in the n-channel transistor are electrons, the source voltage is lower than the drain voltage such that electrons can flow, and the current flows from the drain to the source.

As shown in part (a) of FIG. 3, when the first scan signal Scan1 is applied to the gate of the first switching TFT T1 at a high level (+Bias), which is an on voltage, the first switching TFT T1 is turned on. When the first switching TFT T1 is turned on, electrons, which are carriers, are trapped in the oxide semiconductor active layer Oxide ACT to form a channel. Accordingly, electrons can move from the source to the drain.

As shown in part (b) of FIG. 3, when the on voltage (+Bias) of the gate of the first switching TFT T1 is converted to a low level (−Bias) which is an off voltage, the source and the drain are temporarily coupled to the active layer and thus a kick-back phenomenon in which the voltage rapidly changes to the off-voltage (−Bias) of the gate and then returns to the original potential occurs.

As shown in part (c) of FIG. 3, after the kick-back phenomenon, the first switching TFT T1 maintains an off state, but carriers trapped in the active layer of the first switching TFT T1 are de-trapped to the source and the drain of the first switching TFT T1, and thus charge injection in which electrons are injected into the second node N2 connected to the gate electrode of the driving TFT DT can occur. When charge injection occurs at the second node N2, the potential of the gate electrode of the driving TFT DT decreases, resulting in an increase in the luminance of an image. Since the luminance increase due to charge injection becomes more severe as time elapses after the first switching TFT T1 is turned off, it can cause flicker during low-speed operation. This type of flicker may be noticeable to a viewer and impair image quality.

In view of the issues described above, a sub-pixel structure according to an embodiment of the present disclosure can be applied, in order to reduce charge injection from occurring in the gate electrode of the driving TFT DT when the first switching TFT T1 is implemented as an oxide transistor.

Figure 5:
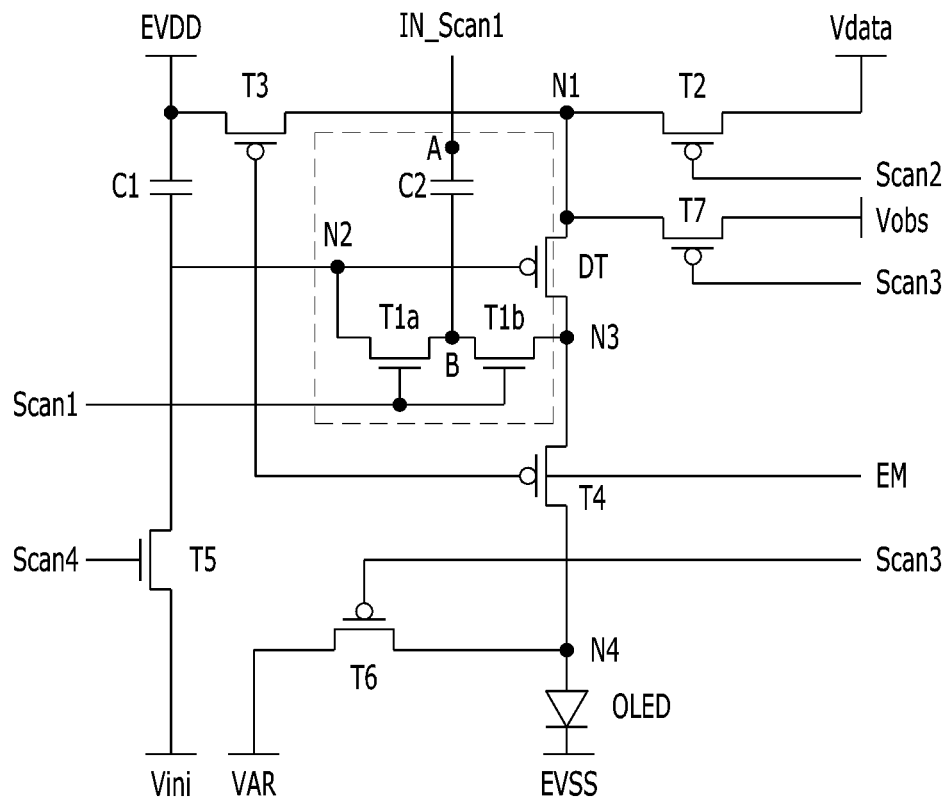
FIG. 5 is a circuit diagram of a sub-pixel according to an embodiment of the present disclosure.
Figure 6:
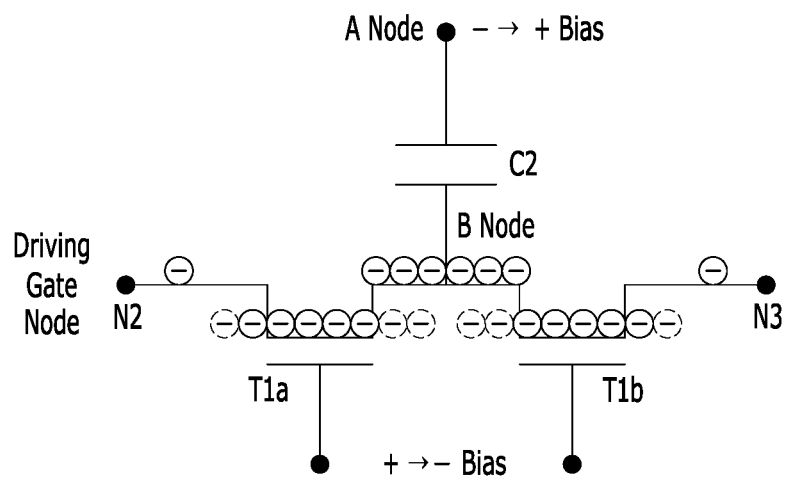
FIG. 6 is a diagram illustrating operating states of some components of the sub-pixel circuit of FIG. 5 according to an embodiment of the present disclosure.
Figure 7:
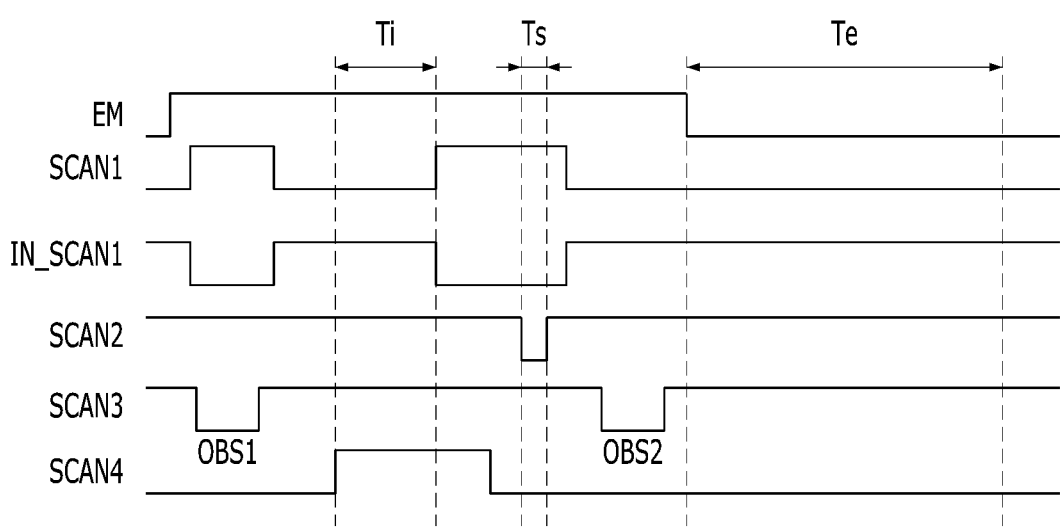
FIG. 7 is a driving waveform diagram of the sub-pixel of FIG. 5 according to an embodiment of the present disclosure.

FIG. 5 is a circuit diagram of a sub-pixel according to an embodiment of the present disclosure, FIG. 6 is a diagram illustrating an operating state of some components of the sub-pixel circuit of FIG. 5 according to an embodiment of the present disclosure, and FIG. 7 is a driving waveform diagram of the sub-pixel of FIG. 5 according to an embodiment of the present disclosure.

Referring to FIGS. 5 to 7, a sub-pixel according to an embodiment of the present disclosure can be provided with a high-potential voltage EVDD, a low-potential voltage EVSS, an initialization voltage VINI, an anode reset voltage VAR, and an on bias stress (OBS) voltage Vobs and can receive first to fourth scan signals Scan1 to Scan4, an inverted first scan signal IN_Scan1, an emission signal EM, and a data voltage signal Vdata.

One sub-pixel SP includes an OLED, a driving TFT DT, a first capacitor C1, a switching circuit includes a first switching TFTa T1a and a first switching TFTb T1b, a blocking unit includes a second capacitor C2, and second to seventh switching TFTs T2 to T7. Each TFT of the sub-pixel SP can be a p-type MOSFET (PMOS) or an n-type MOSFET (NMOS). For example, the first switching TFTa T1a, the first switching TFTb T1b and the fifth switching TFT T5 can be implemented as n-type MOSFETs, and the driving TFT DT and the remaining switching TFTs T2 to T4, T6 and T7 can be implemented as p-type MOSFETs, but the present disclosure is not limited thereto. Also, the first switching TFTa can be referred to as a first-first switching transistor and the first switching TFTb can be referred to as a first-second switching transistor.

The sub-pixel of FIG. 5 differs from the sub-pixel of FIG. 2 with respect to the circuit configuration of the region where the first switching TFT T1 is connected, when the first switching TFT T1 is implemented as an oxide transistor. In the sub-pixel of FIG. 2, the first switching TFT T1 that is turned on/off according to the first scan signal Scan1 is connected between the second node N2 and the third node N3. On the other hand, in the sub-pixel according to the embodiment of the present disclosure shown in FIG. 5, the switching circuit includes the first switching TFTa T1a and the first switching TFTb T1b connected in series between the second node N2 and the third node N3, and the blocking unit includes the second capacitor C2 having one end connected to a connection node between the first switching TFTa T1a and the first switching TFTb T1b and another end of the second capacitor C2 being connected to the inverted first scan signal IN_Scan1. Also, the gates of first switching TFTa T1a and the first switching TFTb T1b are tied together and connected to the first scan signal SCAN1. According to an embodiment, the first switching TFTa T1a and the first switching TFTb T1b can be referred to as a switching transistor having a dual gate structure, but embodiments are not limited thereto.

The first switching TFTa T1a and the first switching TFTb T1b connect the gate electrode and the drain electrode, which is the second electrode, of the driving TFT DT to diode-connect the driving TFT DT. The first switching TFTa Tia and the first switching TFTb T1b are simultaneously turned on/off according to the first scan signal SCAN1. The first switching TFTa T1a can include a gate electrode connected to the input line of the first scan signal SCAN1, a first electrode connected to the second node N2, and a second electrode connected to a node B. The first switching TFTb T1b can include a gate electrode connected to the input line of the first scan signal SCAN1, a first electrode connected to the node B, and a second electrode connected to the third node N3. The first switching TFTa T1a and the first switching TFTb T1b can be n-type MOSFETs (NMOSs) in order to reduce off current and minimize leakage current during a turn-off period, and can be implemented as oxide thin film transistors. Accordingly, the first switching TFTa T1*a* and the first switching TFTb T1*b* diode-connect the gate electrode and the drain electrode of the driving TFT DT in response to the first scan signal Scan1 at a high level, which is a turn-on voltage.

The second capacitor C2 includes one electrode connected to the node B and the other electrode connected to a node A. Here, the node A is connected to the input line of the inverted first scan signal IN_Scan1. Therefore, when the first scan signal Scan1 at the high level, which is the on-voltage, is applied to the first switching TFTa T1*a* and the first switching TFTb T1*b*, the first scan signal Scan1 at a low level is applied to the node A. When the first scan signal Scan1 at the low level, which is an off voltage, is applied to the first switching TFTa T1*a* and the first switching TFTb T1*b*, the first scan signal Scan1 at the high level is applied to the node A. Therefore, when a positive bias acts on the node B to which one electrode of the second capacitor C2 is connected, a negative bias acts on the node A to which the other electrode is connected, and when the negative bias acts on the node B, the positive bias can act on the node A to which the other electrode is connected.

Referring to FIG. 6, when the voltages of the gates of the first switching TFTa T1*a* and the first switching TFTb T1*b* transition from the high level (+Bias) to the low level (−Bias), then the voltage of the node A to which the other electrode of the second capacitor C2 is connected transitions from the low level (−Bias) to the high level (+Bias) occurs. In other words, when the gates of the first switching TFTa T1*a* and the first switching TFTb T1*b* transition from high to low, node A transitions from low to high. Thus, the gates of the first switching TFTa T1*a* and the first switching TFTb T1*b* and node A experience opposite state transitions relative to each other.

When the gate voltages of the first switching TFTa T1*a* and the first switching TFTb T1*b* transition from the high level (+Bias) to the low level (−Bias) according to the first scan signal Scan1, the sources and the drains are temporarily coupled to the active layer at the low level (−Bias), and thus the first switching TFTa T1*a* and the first switching TFTb T1*b* are turned off. Accordingly, the flow of electrons, which are carriers, is stopped, and thus the node B to which one electrode of the second capacitor C2 is connected has the low level (−Bias). At the same time, a transition from the low level (−Bias) to the high level (+Bias) occurs at the node A to which the other electrode of the second capacitor C2 is connected according to the inverted first scan signal IN_Scan1. Since the node A has the high level (+Bias), the amount of charge injection into the node B connected to the second capacitor C2 can increase. In other words, any undesirable charge injection experienced by node B can be sucked away to node A via the second capacitor C2 and the inverted first scan signal IN_Scan1, and the gate node of the driving TFT DT can be protected. Accordingly, charge injection occurring at the second node N2 connected to the gate node of the driving TFT DT can be reduced or prevented, and any image flickering can be prevented and image quality can be improved.

FIG. 7 is a driving waveform diagram of the sub-pixel of FIG. 5 according to an embodiment of the present disclosure.

Referring to FIG. 7, an operation period of the sub-pixel SP according to an embodiment of the present disclosure can include an initial period Ti, a sampling period Ts, and an emission period Te.

The initial period Ti and the sampling period Ts can be included in a non-emission period in which the emission signal EM is applied at an off level (e.g., during a blank period). During this non-emission period, a plurality of on bias stress (OBS) operations can be performed. During the OBS operations, the third scan signal Scan3 is applied at a low level that is the turn-on voltage. The sixth switching TFT T6 that applies the anode reset voltage VAR to the fourth node N4 corresponding to the anode of the OLED and the seventh switching TFT T7 that applies the OBS voltage Vobs to the first node N1 of the driving TFT DT are turned on in response to the third scan signal Scan3 at the turn-on level. When the sixth switching TFT T6 is turned on, the anode of the OLED is reset by the anode reset voltage VAR, and thus the emission characteristics of the OLED can be maintained. When the seventh switching TFT T7 is turned on, the OBS voltage Vobs is applied to the driving TFT DT, and thus a hysteresis phenomenon in the driving TFT DT can be alleviated.

Figure 8:
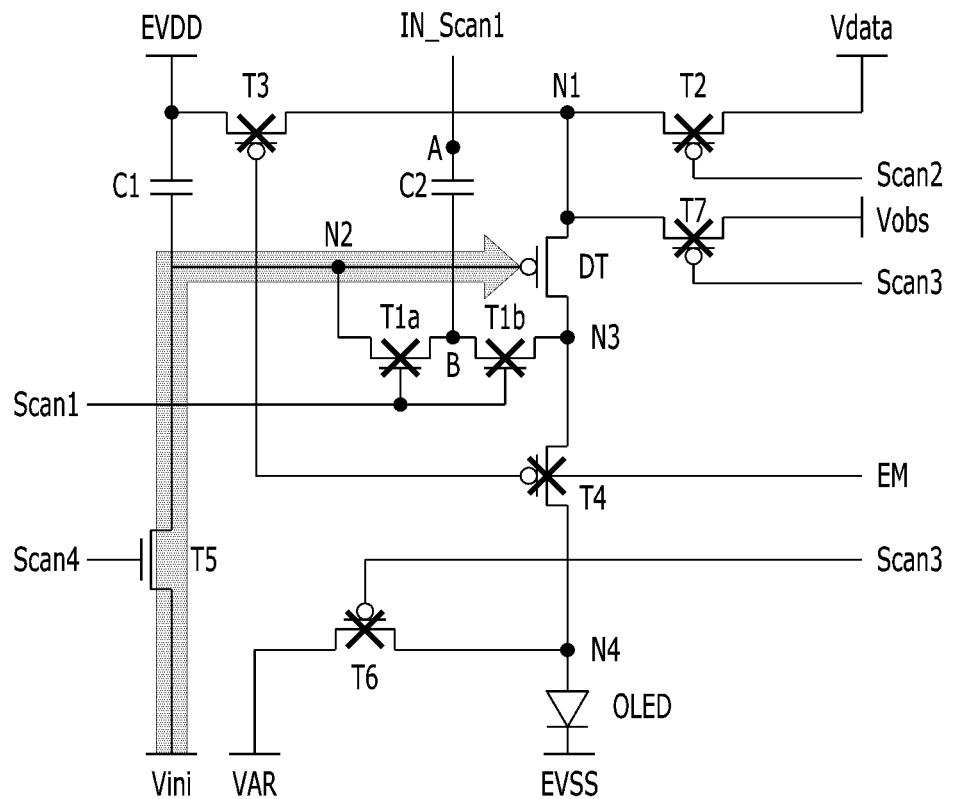
FIGS. 8 to 10 are diagrams illustrating a method of driving a sub-pixel according to an embodiment of the present disclosure.
Figure 8:
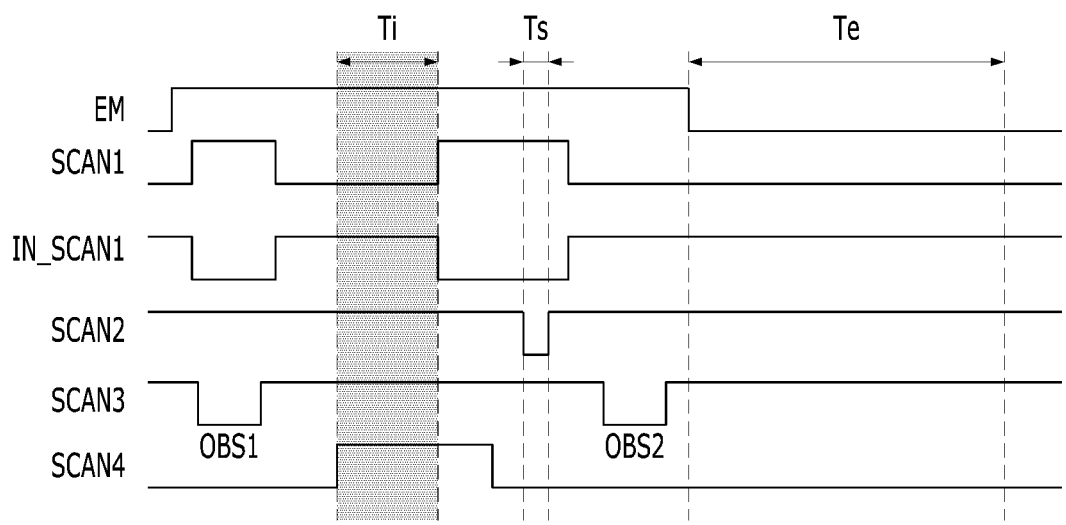
Figure 9:
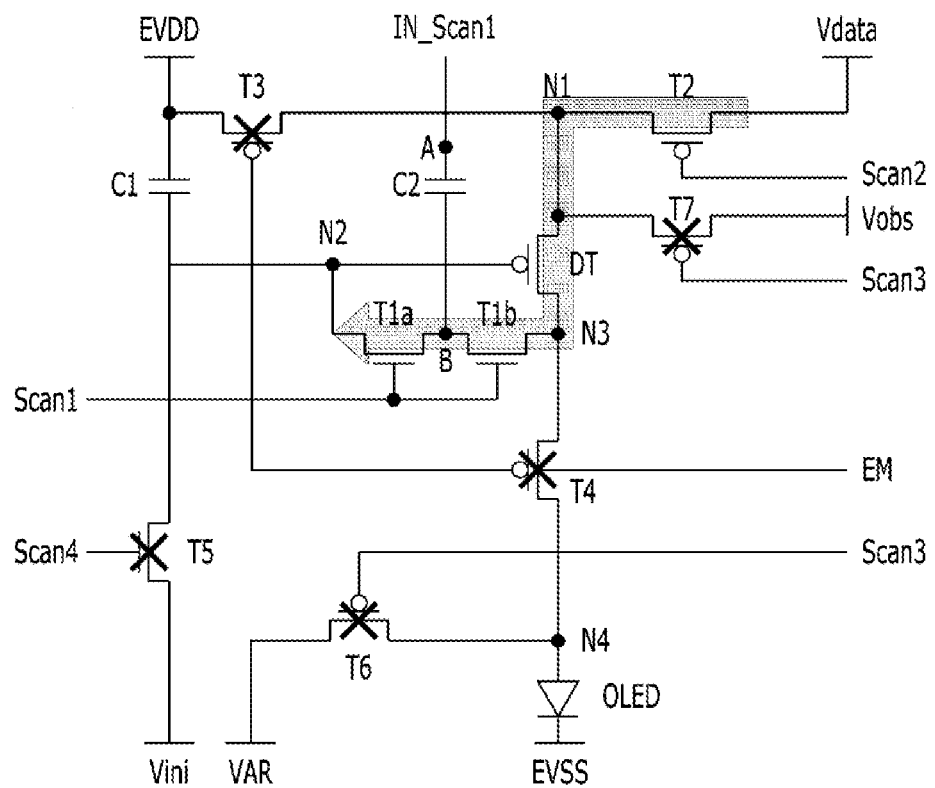
Figure 9:
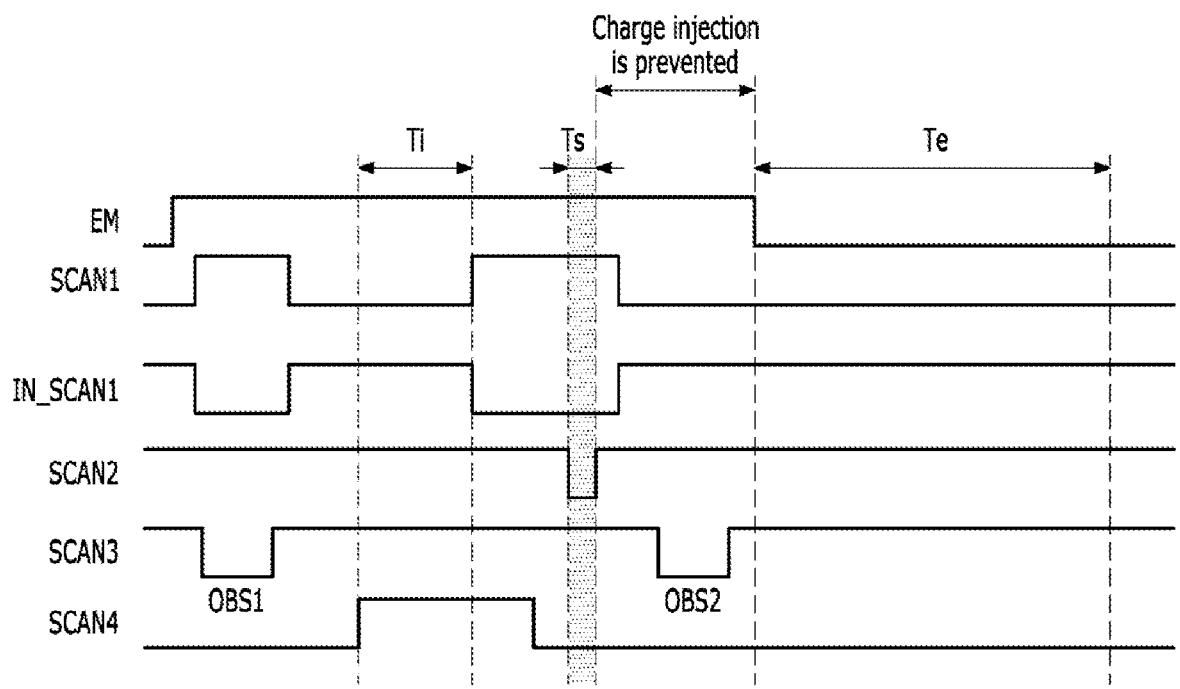
Figure 10:
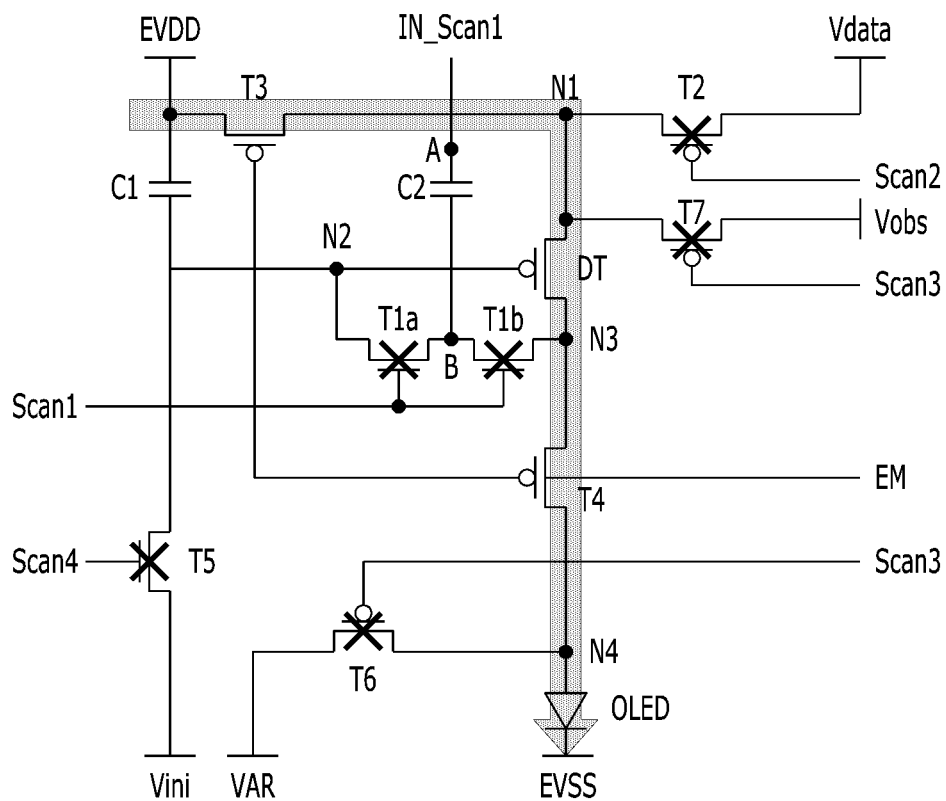
Figure 10:
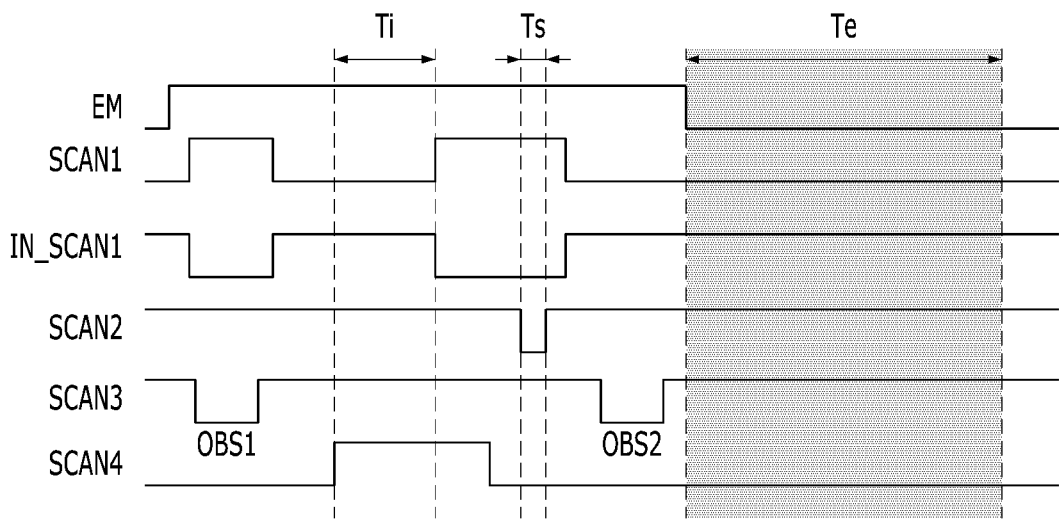

FIGS. 8 to 10 are diagrams illustrating a method of driving the sub-pixel in the initial period Ti, the sampling period Ts, and the emission period Te according to an embodiment of the present disclosure.

FIG. 8 is an equivalent circuit diagram showing an operating state of the sub-pixel in the initial period Ti.

During the initial period Ti, only the fourth scan signal Scan4 is applied at an on level, and all signals Scan1, Scan2, Scan3, and EM are applied at an off level, except for the fourth scan signal Scan4. Accordingly, among the switching TFTs included in the sub-pixel, the fifth switching TFT T5 is turned on and the remaining switching TFTs T1*a*. T1*b*, T2 to T4, T6, and T7 are all turned off.

During the initial period Ti, the fifth switching TFT T5 turned on by the fourth scan signal Scan4 applies the initialization voltage VINI to the second node N2. Accordingly, the gate electrode of the driving TFT DT connected to the second node N2 can be initialized to the initialization voltage VINI.

FIG. 9 is an equivalent circuit diagram showing an operating state of the sub-pixel in the sampling period Ts.

During the sampling period Ts, the first scan signal Scan1 and the second scan signal Scan2 are applied at the on level, and the remaining signals Scan3, Scan4, and EM are applied at the off level. Accordingly, among the switching TFTs included in the sub-pixel, the first switching TFTa T1*a*, the first switching TFTb T1*b*, and the second switching TFT T2 are turned on, and the remaining switching TFTs T3 to T7 are turned off.

The first switching TFTa T1*a* and the first switching TFTb T1*b* turned on by the first scan signal Scan1 during the sampling period Ts connect the second node N2 and the third node N3. Accordingly, the gate electrode and the drain electrode of the driving TFT DT are diode-connected.

The second switching TFT T2 turned on by the second scan signal Scan2 during the sampling period Ts applies the data voltage Vdata to the first node N1 corresponding to the source electrode of the driving TFT DT. As the data voltage Vdata is applied to the source electrode, a current Ids flows between the source and the drain of the driving TFT DT. Since the gate electrode and the drain electrode of the driving TFT DT are diode-connected, the voltage of the second node N2 to which the gate electrode is connected increases due to the current flowing from the source electrode to the drain electrode. During the sampling period, the second node N2 is charged with a voltage Vdata-|Vth| corresponding to the difference between the data voltage Vdata and the threshold voltage Vth of the driving TFT DT.

After completion of the sampling operation, when the first scan signal Scan1 is switched to the off level, the first switching TFTa T1*a* and the first switching TFTb T1*b* are turned off. Accordingly, the node B to which one electrode of the second capacitor C2 is connected has the low level (−Bias). At the same time, the inverted first scan signal IN_Scan1 is applied to the node A to which the other electrode of the second capacitor C2 is connected and thus the node A is switched to the high level (+Bias). Since the node A has the high level (+Bias), the amount of charge injection into the node B connected to the second capacitor C2 can increase. Accordingly, the effect of charge injection in which electrons move from the active regions of the first switching TFTa T1a and the first switching TFTb Tb in the off state to the second node N2 connected to the gate electrode of the driving TFT DT can be reduced.

FIG. 10 is an equivalent circuit diagram showing an operating state of the sub-pixel during the emission period Te.

During the emission period Te, only the emission signal EM is applied at the on level, and all scan signals Scan1, Scan2, and Scan3 are applied at the off level.

When the emission signal EM is applied at the low level that is the turn-on voltage, the third and fourth switching TFTs T3 and T4 are turned on. As the third switching TFT T3 is turned on, the high-potential voltage EVDD is applied to the first node N1, and as the fourth switching TFT T4 is turned on, a current path is formed through the third node N3 and the fourth node N4.

Accordingly, a driving current is applied to the OLED through the driving TFT DT according to the voltage of the second node N2 connected to the gate electrode of the driving TFT DT, and thus the OLED can emit light.

Figure 11:
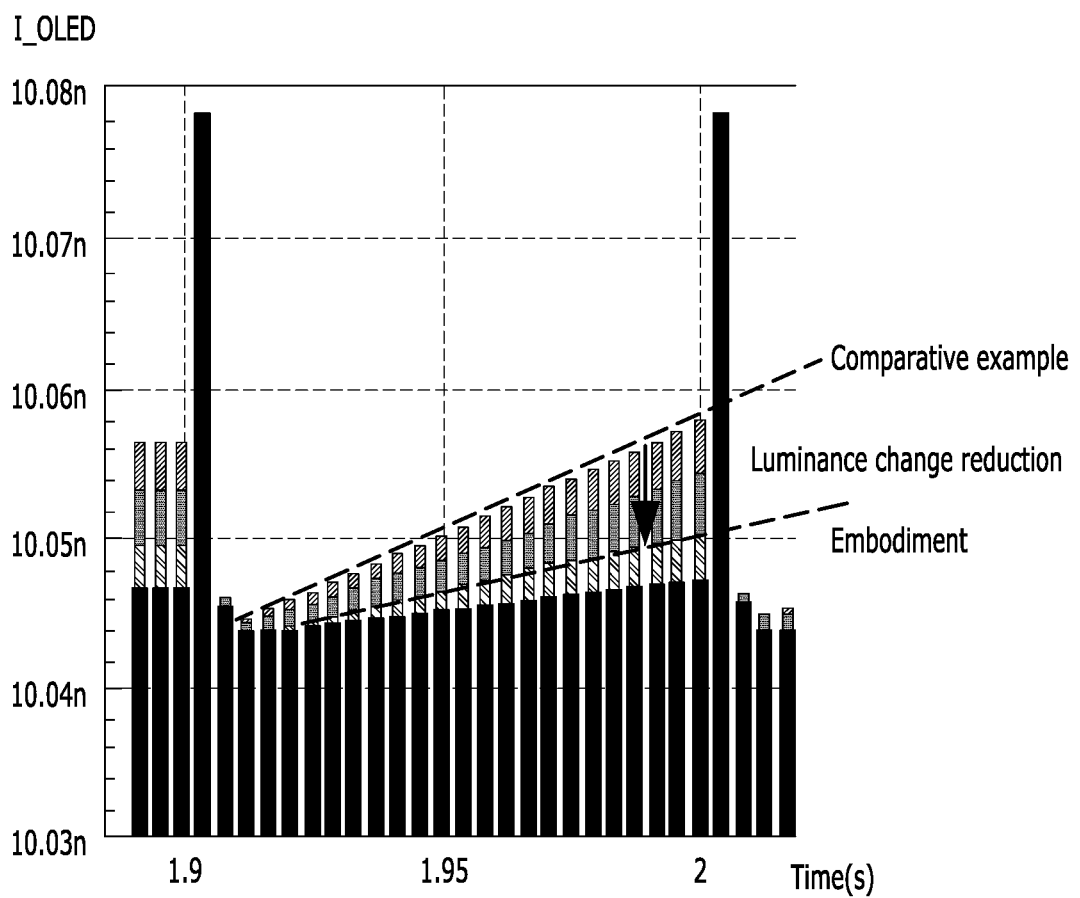
FIG. 11 is a graph showing simulation results of a display device according to an embodiment of the present disclosure and a display device according to a comparative example.

FIG. 11 is a graph showing simulation results of the different luminance levels of the display device according to the embodiment of the present disclosure and a display device according to a comparative example. A screen is displayed using the sub-pixel shown in FIG. 2 in the comparative example, and a screen is displayed using the sub-pixel shown in FIG. 5 in the embodiment. The horizontal axis of the graph represents the driving time, and the vertical axis represents the measured value of a current I_OLED flowing through the OLED. As the current value increases, the luminance increases.

Referring to FIG. 11, when the screen is displayed using the sub-pixel configuration (FIG. 2) of the comparative example, the amount of current increases by about 0.014n from 10.044n to 10.058n during the emission period, which increases the luminance and can cause an undesirable flicker in brightness that can be noticeable by a viewer and impair image quality.

On the other hand, when the screen is displayed using the sub-pixel configuration (FIG. 5) of the embodiment, it can be ascertained that the amount of current increases by about 0.06n from 10.044n to 10.05n during the emission period. In this manner, when the sub-pixel configuration (FIG. 5) of the embodiment is used, charge injection is reduced during the emission period, and thus the current increase amount is reduced by 50% or more compared to the comparative example. As a result, the luminance change amount can also be reduced and a noticeable flicker can be minimized or prevented, and more stable luminance can be provided which improves image quality for a better viewing experience.

As described above, the display device according to the embodiment of the present disclosure can minimize the amount of electrons moving to the gate node of the driving transistor when a switching transistor having an oxide semiconductor layer is in an off state by adding a capacitor to the connection terminal of the switching transistor, thereby blocking leakage current from flowing into the gate node of the driving transistor. Accordingly, it is possible to minimize any change in the luminance of an image, provide more stable and uniform brightness, and reduce flicker during a low-speed operation.

The embodiments of the present disclosure have the following effects.

According to the embodiments of the present disclosure, it is possible to provide a display device capable of improving the accuracy and stability of operations of driving transistors and switching transistors of sub-pixels.

According to the embodiments of the present disclosure, it is possible to provide a display device capable of improving operation stability of sub-pixels by reducing potential fluctuation occurring during operation of oxide semiconductor transistors included in the sub-pixels.

According to the embodiments of the present disclosure, it is possible to provide a display device capable of preventing luminance variation by reducing charge injection occurring at a gate node of a driving transistor due to an oxide semiconductor transistor connected to the gate node of the driving transistor.

Effects according to the present disclosure are not limited by the above description and more various effects are included in the present disclosure.

Although the embodiments of the present disclosure have been described in more detail with reference to the accompanying drawings, the present disclosure is not necessarily limited to these embodiments and can be modified and implemented in various manners without departing from the technical spirit of the present disclosure. Therefore, the embodiments disclosed herein are not intended to limit the technical spirit of the present disclosure, but to explain, and the scope of the technical spirit of the present disclosure is not limited by these embodiments. Therefore, the embodiments described above should be construed in all aspects as illustrative and not restrictive. The scope of the present disclosure should be determined by the appended claims and their legal equivalents, not by the above description, and all changes coming within the meaning and equivalency range of the appended claims are intended to be embraced therein.

What is claimed is:

1. A display device comprising:
a light-emitting element;
a driving transistor including a first electrode connected to a first node, a gate electrode connected to a second node, and a second electrode connected to a third node connected to the light-emitting element;
a switching circuit includes a first-first switching transistor connected in series with a first-second switching transistor, the switching circuit connected between the second node and the third node; and
a blocking device configured to block leakage current from flowing from the switching circuit to the second node when the switching circuit is turned off,
wherein the switching circuit is configured to:
in response to receiving a first scan signal at an on level, turn on the switching circuit and connect the second node with the third node, and
in response to receiving the first scan signal at an off level, turn off the switching circuit, and
wherein the blocking device is further configured to receive an inverted first scan signal and activate when the switching circuit is turned off to block the leakage current flowing from the switching circuit to the second node.

2. The display device of claim 1, wherein the switching circuit is further configured to be turned on in response to the first scan signal being input to a gate electrode of the switching circuit to form a channel layer, and
wherein the blocking device includes a capacitor connected to a node opposite to the gate electrode of the switching circuit with respect to the channel layer.

3. The display device of claim 2, wherein the switching circuit is configured to receive the first scan signal at a high level to form the channel layer, and
wherein the blocking device is configured to block the leakage current based on receiving the inverted first scan signal.

4. The display device of claim 3, wherein the capacitor includes:
a first electrode connected to the node opposite to the gate electrode of the switching circuit; and
a second electrode configured to receive the inverted first scan signal as an input.

5. The display device of claim 1,
wherein the first-first switching transistor including a gate electrode configured to receive the first scan signal as an input, a first electrode connected to the second node, and a second electrode connected to a node B, and
wherein the first-second switching transistor including a gate electrode configured to receive the first scan signal as an input, a first electrode connected to the node B, and a second electrode connected to the third node.

6. The display device of claim 5, wherein the blocking device includes a capacitor including a first electrode connected to the node B and a second electrode configured to receive the inverted first scan signal as an input.

7. The display device of claim 1, wherein the switching circuit includes an n-type oxide transistor.

8. A display device comprising:
a light-emitting element;
a driving transistor including a first electrode connected to a first node, a gate electrode connected to a second node, and a second electrode connected to a third node connected to the light-emitting element;
a switching circuit including a first-first switching transistor connected in series with a first-second switching transistor, the switching circuit configured to connect the third node to the second node; and
a capacitor connected to a node opposite to the gate electrode of the switching circuit with respect to the channel layer, the capacitor being configured to block leakage current generated in the channel layer based on receiving an inverted first scan signal when the switching circuit is turned off.

9. The display device of claim 8,
wherein the first-first switching transistor including a gate electrode configured to receive the first scan signal as an input, a first electrode connected to the second node, and a second electrode connected to a node B, and
wherein the first-second switching transistor including a gate electrode configured to receive the first scan signal as an input, a first electrode connected to the node B, and a second electrode connected to the third node.

10. The display device of claim 9, wherein the capacitor includes:
a first electrode connected to the node B; and
a second electrode configured to receive the inverted first scan signal as an input.

11. The display device of claim 9, wherein the first-first switching transistor and the first-second switching transistor are n-type oxide transistors.

12. The display device of claim 9, wherein the first-first switching transistor and the first-second switching transistor are connected in series, and
wherein a gate of the first-first switching transistor is connected to a gate of the first-second switching transistor.

13. The display device of claim 12, wherein a first electrode of the capacitor is connected between the first-first switching transistor and the first-second switching transistor.

14. A subpixel circuit, comprising:
a light-emitting element;
a driving transistor configured to provide a driving current to the light emitting element;
a switching circuit including a first-first switching transistor connected in series with a first-second switching transistor, the switching circuit connected between a gate electrode of the driving transistor and a drain electrode of the driving transistor, the switching circuit being configured to receive a first scan signal; and
a blocking device connected to the switching circuit, the blocking device being configured to receive an inverted first scan signal having an opposite waveform than the first scan signal.

15. The subpixel circuit of claim 14, wherein the blocking device is further configured to:
block leakage current from flowing from the switching circuit to the gate electrode of the driving transistor when the switching circuit is turned off.

16. The subpixel circuit of claim 14,
wherein a gate electrode of the first-first switching transistor is connected to a gate electrode of the first-second switching transistor, and
wherein the gate electrodes of the first-first switching transistor and the first-second switching transistor are configured to receive the first scan signal.

17. The subpixel circuit of claim 16, wherein the blocking device includes a capacitor having a first capacitor electrode connected between the first-first switching transistor and the first-second switching transistor and a second capacitor electrode configured to receive the inverted first scan signal.

18. The subpixel circuit of claim 16, wherein the first-first switching transistor and the first-second switching transistor are oxide transistors.

19. The subpixel circuit of claim 14, wherein the switching circuit includes a dual gate structure.

* * * * *